United States Patent [19]

Nakashima

[11] Patent Number: 5,543,106
[45] Date of Patent: Aug. 6, 1996

[54] METHOD OF POLARIZING PIEZOELECTRIC CERAMIC SUBSTRATE

[75] Inventor: Mikio Nakashima, Nagaokakyo, Japan

[73] Assignee: Murata Manufacturing Co., Ltd., Japan

[21] Appl. No.: 364,963

[22] Filed: Dec. 28, 1994

[30] Foreign Application Priority Data

Dec. 29, 1993 [JP] Japan ................................. 5-352503

[51] Int. Cl.⁶ ............................................ B28B 11/00
[52] U.S. Cl. .................................... 264/430; 264/40.1
[58] Field of Search ................... 264/22, 40.1, 430, 264/406

[56] References Cited

U.S. PATENT DOCUMENTS 5,310,511  5/1994  Marcus ............................... 264/22
5,444,326  8/1995  Yoshida ............................. 310/359

FOREIGN PATENT DOCUMENTS 4-262611  9/1992  Japan .

*Primary Examiner*—Christopher A. Fiorilla
*Attorney, Agent, or Firm*—Ostrolenk, Faber, Gerb & Soffen, LLP

[57] ABSTRACT

A plurality of polarization electrodes are provided oppositely on front and back surfaces of a piezoelectric ceramic substrate, while the polarization electrodes on the front surface and the polarization electrodes on the back surface are connected respectively by connecting electrodes which are formed on positions not opposed to each other. A dc voltage is applied across the polarization electrodes on the front and back surfaces for polarizing the substrate to form a plurality of polarized portions in the substrate. Thus, it is possible to reduce stress concentration in polarizing process, thereby inhibiting the substrate from cracking.

8 Claims, 4 Drawing Sheets

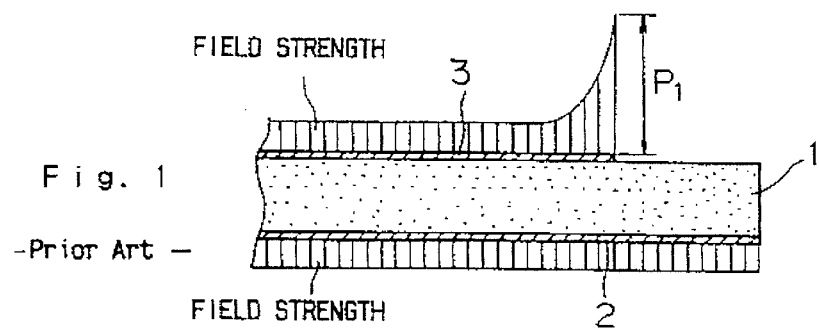
Fig. 1 —Prior Art—
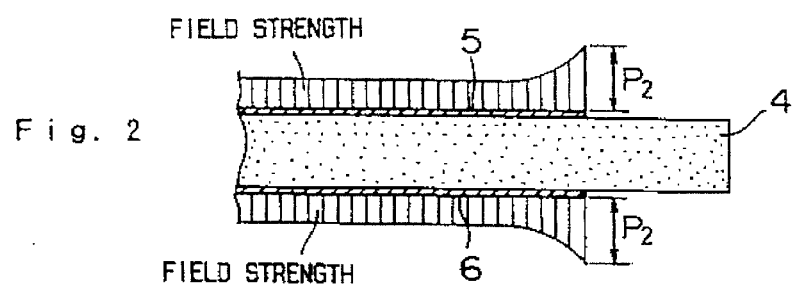
Fig. 2
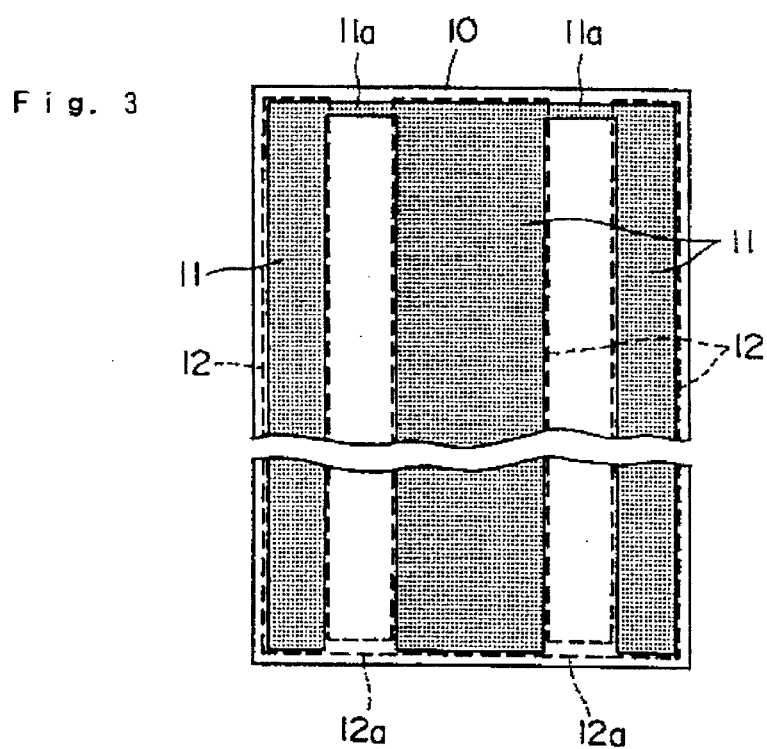
Fig. 3

METHOD OF POLARIZING PIEZOELECTRIC CERAMIC SUBSTRATE

BACKGROUND OF THE INVENTION

1. Field of the Invention

The present invention relates to a method of polarizing a piezoelectric ceramic substrate, and more particularly, it relates to a partial polarization method which is suitable for polarizing a piezoelectric ceramic substrate for a piezoelectric resonator integrated with a capacitor.

2. Background of the Invention

In order to form an energy trap type piezoelectric resonator and a capacitor on a single piezoelectric substrate, the piezoelectric substrate is generally partially polarized so that a resonator portion and a capacitor portion thereof are brought into polarized and non-polarized states, respectively.

As to such partial polarization, a method of polarizing the overall surface of a piezoelectric ceramic substrate and thereafter depolarizing a capacitor portion by heating or the like is described in Japanese Patent Laying-Open Gazette No. 4-262611 (1992). In this method, although the polarization itself can be simply carried out, it is difficult to depolarize only a specific portion after polarization. Moreover, the degree of polarization may be disadvantageously changed in a portion to be left in the polarized state.

In another conventional method, a piezoelectric ceramic substrate is provided with a polarization electrode only on a portion to be polarized. According to this method, an overall electrode 2 is provided on one surface of a piezoelectric ceramic substrate 1 and a partial electrode 3 corresponding to a polarized portion is provided on another surface as shown in FIG. 1, so that a dc voltage is applied across the electrodes 2 and 3 in general. In this case, however, whereas field strength on the side of the overall electrode 2 is substantially uniform, field strength on the side of the partial electrode 3 is greatly increased in its boundary portion such that its peak value $P_1$ becomes high. Consequently, the ceramic substrate 1 is broken or cracked at the boundary portion of the partial electrode 3 in a ratio of several 10%, leading to an extremely inferior yield.

SUMMARY OF THE INVENTION

Accordingly, at least one object of the present invention is to provide a method of polarizing a piezoelectric ceramic substrate, which can reduce breaking or cracking of the substrate in boundary portions of polarization electrodes in polarizing process. Another object of the preferred embodiments of the present invention is to provide a method of polarizing a piezoelectric ceramic substrate which can reduce stress concentration to connecting portions in polarizing process, thereby inhibiting the substrate from cracking.

The preferred embodiments of the present invention provide a method of polarizing a piezoelectric ceramic substrate for forming a plurality of polarized portions in a piezoelectric ceramic substrate. A plurality of polarization electrodes are provided oppositely on front and back surfaces of the substrate at positions corresponding to the polarized portions. Also, connecting electrodes are provided on the front and back surfaces of the substrate for connecting the polarization electrodes on the front surface and for connecting the polarization electrodes on the back surface, respectively, in such a way that the connecting electrodes are not opposed to each other. Then, a voltage is applied across the opposed polarization electrodes, for polarizing the substrate.

Referring to FIG. 2, when a dc voltage is applied across the partial polarization electrodes 5 and 6 for polarizing the substrate 4, field strengths of the electrodes 5 and 6 are equivalently increased in boundary portions thereof, whereby peak values $P_2$ at the boundary portions can be reduced as compared with the peak value $P_1$ of the field strength shown in FIG. 1. Therefore, it is possible to reduce breaking or cracking of the substrate 4 at the boundary portions of the electrodes 5 and 6.

In order to produce a number of elements from a single substrate, it is necessary to form a plurality of polarization electrodes on both surfaces of the substrate. In this case, it is preferable to connect the polarization electrodes by connecting electrodes, for the purpose of polarizing the overall substrate by single voltage application and equalizing electric potentials of the polarization electrodes. In this case, however, stress caused between polarized portions and non-polarized portions of the substrate is concentrated to the connecting electrodes, which are weak portions of the electrode pattern, whereby cracks of the substrate around joints of the connecting electrodes tend to occur. According to the preferred embodiments of the present invention, it is possible to reduce stress concentration to the connecting electrodes by providing these connecting electrodes in positions which are not opposed to each other on the front and back surfaces of the substrate, thereby breaks or cracks of the substrate at the joints of the connecting electrodes are reduced. Consequently, it is possible to improve the yield in polarizing process.

The foregoing and other objects, features, aspects and advantages of the preferred embodiments of the present invention will become more apparent from the following detailed description of the preferred embodiments of the present invention when taken in conjunction with the accompanying drawings.

BRIEF DESCRIPTION OF THE DRAWINGS

FIG. 1 illustrates field strength distribution in a conventional polarizing process of a substrate which is provided with an overall electrode on one surface and a partial electrode on the other surface thereof;

FIG. 2 illustrates field strength distribution in polarizing process of a substrate which is provided with partial polarization electrodes oppositely on both surfaces thereof;

FIG. 3 illustrates an electrode pattern for polarization according to a first preferred embodiment of the present invention;

DESCRIPTION OF PREFERRED EMBODIMENTS

Figure 4A:
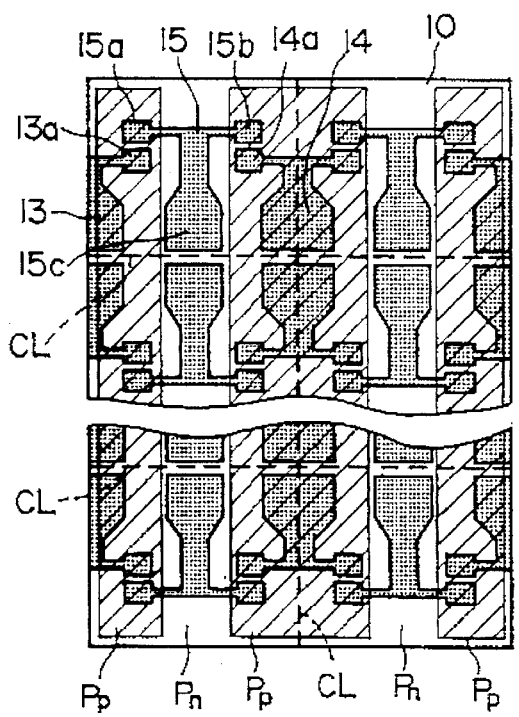
FIG. 4A is a front view of a mother substrate provided with individual electrodes.

A method of manufacturing piezoelectric components according to a first preferred embodiment of the present invention is now described referring to FIGS. 3–6.

According to this preferred method, PZT ($Pb(Ti,Zr)O_3$) around a phase boundary between a tetragonal system and a rhombohedral system is employed as a piezoelectric ceramic material in practice, to prepare a rectangular mother substrate 10 preferably having a thickness of about 0.205 mm. This mother substrate 10 is employed to produce a plurality of filter elements containing load capacitances of 10.7 MHz (see FIGS. 5A and 5B) vibrating in a thickness expansion mode, for example.

First, a plurality of strip-shaped partial polarization electrode 11 and 12 are formed on front and back surfaces of the mother substrate 10 disposed substantially parallel to each other by a well-known method such as screen printing, as shown in FIG. 3. Referring to FIG. 3, the electrodes 11 and 12 are formed on opposite positions of the front and back surfaces. These electrodes 11 and 12 are connected with each other by narrow connecting electrodes 11a and 12a, respectively. The connecting electrodes 11a on the front surface are formed on one side edge portion of the mother substrate 10, while the connecting electrodes 12a on the back surface are formed on an opposite side edge portion. The connecting electrodes 11a and 12a are preferably formed on positions not corresponding to individual electrodes 13–16 (see FIGS. 4A and 4B).

The partial electrodes 11 and 12 are not restricted to the strip shapes shown in FIG. 3, but the shapes thereof may be modified in response to the portion to be polarized.

Then, a dc voltage is applied across the polarization electrodes 11 and 12, thereby partially polarizing the mother substrate 10 along its thickness. In a preferred embodiments of the a dc voltage of 500 V is applied across the partial electrodes 11 and 12 at a temperature of 60° C. for 30 minutes.

The polarized mother substrate 10 is left in the atmosphere at a temperature of 150° C. for 1 hour to be aged, and thereafter subjected to measurement of the degree of polarization. Then, a dc voltage is forwardly or reversely applied in order to finely control the degree of polarization. Thus, the mother substrate 10 having a desired degree of polarization is obtained.

Then, the polarization electrodes 11 and 12 as well as the connecting portions 11a and 12a are removed by etching, and thereafter, overall electrode films of about several μm in thickness are formed over both major surfaces of the mother substrate 10 by a method such as evaporation or sputtering.

Figure 4B:
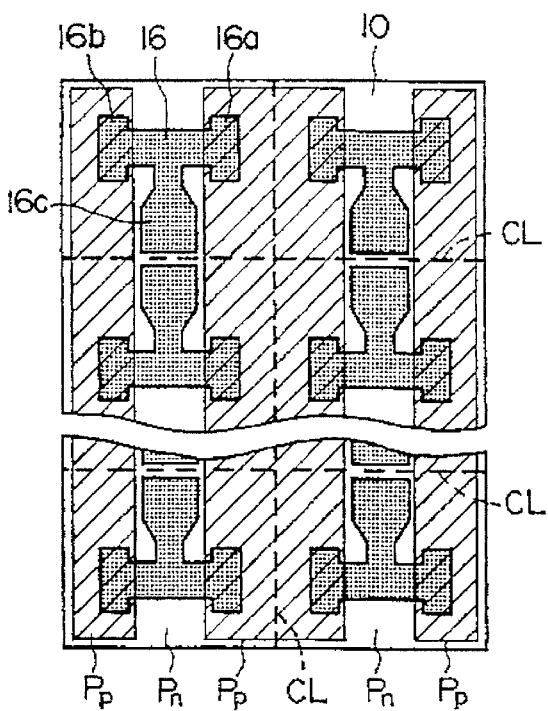
FIG. 4B is a rear view of the mother substrate shown in FIG. 4A.

Then, the overall electrodes thus formed over the major surfaces of the mother substrate 10 are etched so as to dispersedly form the individual electrodes 13 to 16 on these major surfaces, as shown in FIGS. 4A and 4B. Referring to these figures, input, output and intermediate electrodes 13, 14 and 15 are formed on the front surface of the mother substrate 10, while ground electrodes 16 are formed on the back surface. Vibrating portions 13a and 15a of the input and intermediate electrodes 13 and 15 are approximated to each other, while vibrating portions 14a and 15b of the output and intermediate electrodes 14 and 15 are also approximated to each other. Vibrating portions 16a and 16b of the ground electrodes 16 are formed on the back surface of the substrate 10, to be opposed to the vibrating portions 13a, 15a, 14a and 15b. Capacitive portions 15c and 16c of the intermediate and ground electrodes 15 and 16 are also opposed to each other. The vibrating portions 13a, 15a, 14a and 15b correspond to a polarized portion $P_p$ shown by slant lines in FIGS. 4A and 4B, while the capacitive portions 15c and 16c correspond to a non-polarized portion $P_n$ in these figures.

Although remaining portions of the input and output electrodes 13 and 14 other than the vibrating portions 13a and 14a also correspond to the polarized portion $P_p$, undesired vibration would not be caused since there are no electrodes on the back surface which are opposed to these portions, and terminals and the like are soldered to these portions.

Figure 5A:
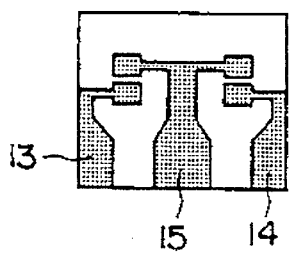
FIG. 5A is a front view of an individual element.
Figure 5B:
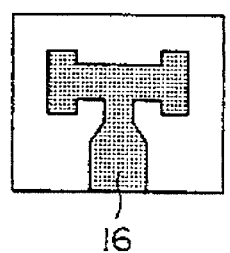
FIG. 5B is a rear view of the individual element shown in FIG. 5A.
Figure 6:
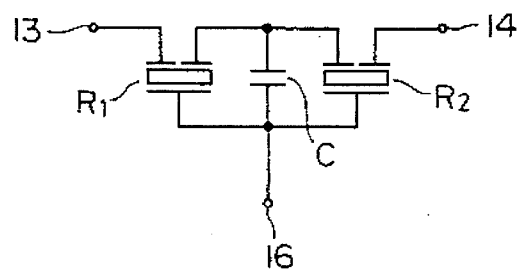
FIG. 6 is a circuit diagram of the filter element shown in FIGS. 5A and 5B.

Thereafter, the mother substrate 10 is cut along broken lines CL shown in FIGS. 4A and 4B, thereby obtaining piezoelectric filter elements containing capacitors, each of which is shown in FIGS. 5A and 5B. FIG. 6 is a circuit diagram of the filter element shown in FIGS. 5A and 5B. Symbols $R_1$ and $R_2$ denote resonators, and symbol C denotes a capacitor.

When the mother substrate 10 is polarized in the electrode pattern shown in FIG. 3, the cracking ratio is reduced as compared with the prior art to the extent of about 3%. Further, the cracks are scarcely caused in the boundary portions of the polarization electrodes 11 and 12 and the connecting electrodes 11a and 12a.

Figure 7:
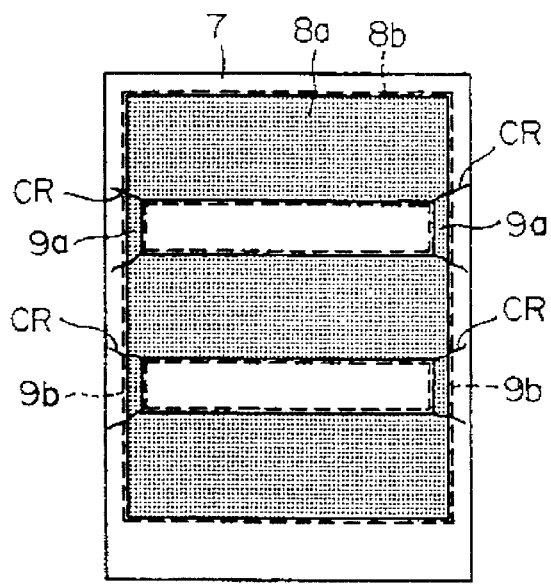
FIG. 7 illustrates an electrode pattern for polarization of a comparative example.
Figure 8:
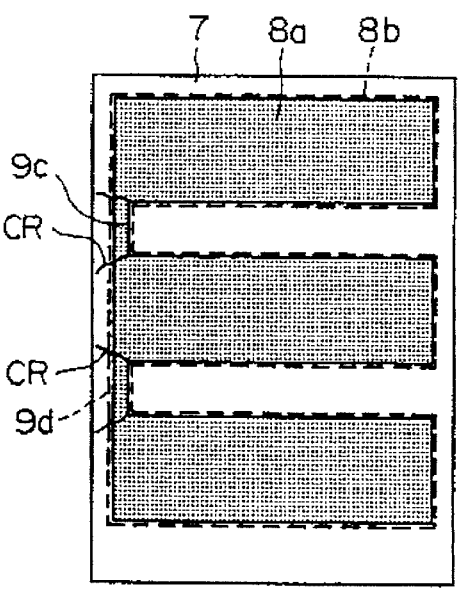
FIG. 8 illustrates an electrode pattern for polarization of another comparative example.
Figure 9:
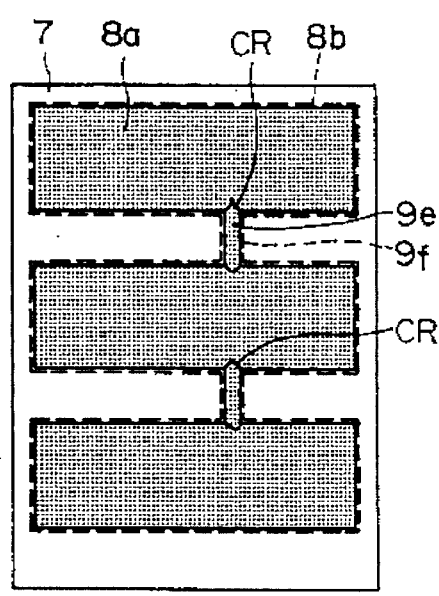
FIG. 9 illustrates an electrode pattern for polarization of still another comparative example.

FIGS. 7–9 illustrate mother substrates which are polarized by different electrode patterns according to comparative examples.

Referring to FIG. 7, a plurality of polarization electrodes 8a and 8b are provided on front and back surfaces of a ceramic substrate 7 in opposite positions, and these electrodes 8a and 8b are connected with each other by thin connecting electrodes 9a and 9b, respectively. The connecting electrodes 9a and 9b are provided on the front and back surfaces of the ceramic substrate 7 in opposite positions along both side edges of the substrate 7.

When the substrate 7 is polarized in the electrode pattern shown in FIG. 7 under conditions similar to those in the preferred embodiment shown in FIG. 3, cracks CR are caused around the joints of the connecting electrodes 9a and 9b. These cracks CR are caused by stress generated between a polarized portion and a non-polarized portion of the piezoelectric ceramic substrate 7 and concentrated at the connecting electrodes 9a and 9b, which are the weak portions of the electrode pattern.

Similar phenomena also take place in electrode patterns shown in FIGS. 8 and 9.

In FIG. 8, connecting electrodes 9c and 9d are oppositely provided along one side edge of the substrate 7, whereas in FIG. 9, the connecting electrodes 9e and 9f are oppositely provided at positions closer to the center of the substrate The ratios of occurrence of such cracks CR are about 10% in FIG. 7, about 7% in FIG. 8 and about 8% in FIG. 9, respectively. Thus, it is clear that the cracking ratio is reduced when the connecting electrodes are provided on front and back surfaces on positions which are not opposed to each other, as shown in FIG. 3.

In the cases of the examples shown in FIGS. 7–9, when the number of elements produced from a single mother substrate is increased in order to improve mass productivity, a polarized portion defined by the connecting electrodes easily interferes with a capacitive portion, to deteriorate characteristics of the elements formed along outer peripheral portions of the mother substrate. Though it is possible to decrease such characteristic deterioration by narrowing the connecting electrodes in width, such narrowed connecting electrodes are easily disconnected. When the connecting electrodes 11a and 12a are not opposed to each other as shown in FIG. 3, on the other hand, the substrate 10 is not polarized by the connecting electrodes 11a and 12a. Therefore, the polarized portion hardly interferes with the capacitive portion even when the number of the elements is increased, whereby it is possible to prevent elements formed along the outer peripheral portions of the mother substrate 10 from deterioration of characteristics. Further, it is possible to increase widths of the connecting electrodes 11a and 12a so as to suppress occurrence of disconnection.

Figure 10:
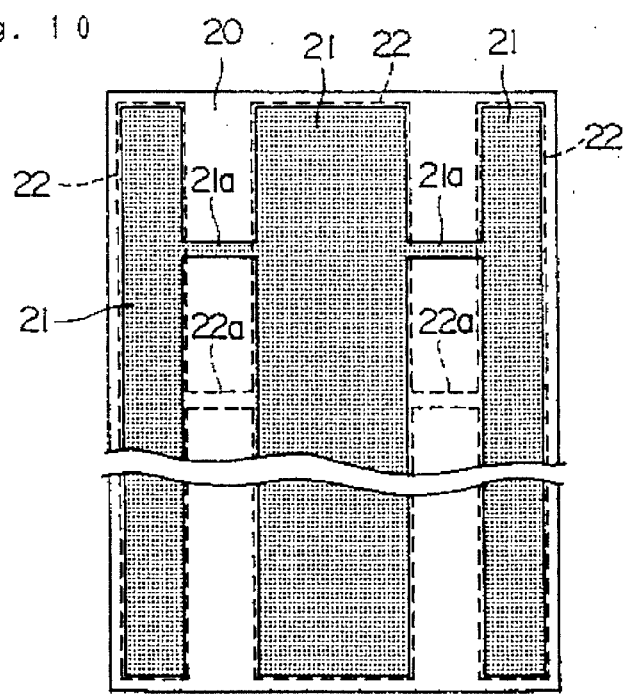
FIG. 10 illustrates an electrode pattern for polarization according to a second preferred embodiment of the present invention.

FIG. 10 illustrates an electrode pattern for polarization according to a second preferred embodiment of the present invention.

Referring to FIG. 10, a plurality of polarization electrodes 21 and 22 are formed on front and back surfaces of a mother substrate 20 in opposite positions, while connecting electrodes 21a and 22a are formed on intermediate portions of the front and back surfaces which are not opposed to each other.

According to this preferred embodiment, it is possible to attain an effect similar to that of the preferred embodiment shown in FIG. 3.

Figure 11:
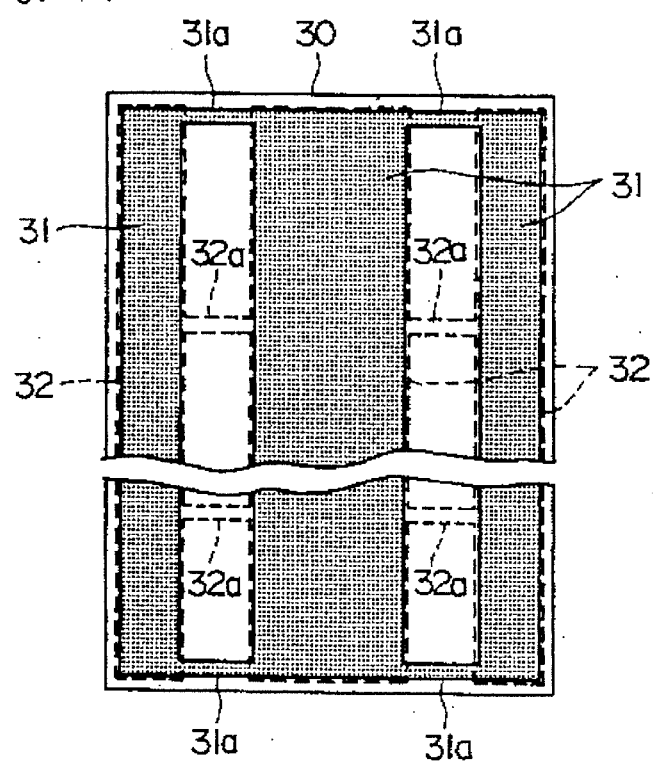
FIG. 11 illustrates an electrode pattern for polarization according to a third preferred embodiment of the present invention.

FIG. 11 illustrates an electrode pattern for polarization according to a third preferred embodiment of the present invention.

Referring to FIG. 11, polarization partial electrodes 31 and 32 are formed on front and back surfaces of a mother substrate 30 in opposite positions, while a plurality of connecting electrodes 31a and a plurality of connecting electrodes 32a are formed on the front and back surfaces in positions which are not opposed to each other respectively.

Also, according to this preferred embodiment, it is possible to achieve an effect similar to that of the preferred embodiment shown in FIG. 3.

Although the preferred embodiments of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of polarizing a piezoelectric ceramic substrate for forming a plurality of polarized portions therein, said method comprising the steps of:

providing a plurality of first polarization electrodes on a front major surface of said piezoelectric ceramic substrate at positions corresponding to said polarized portions and providing a first connecting electrode on said front major surface of said piezoelectric ceramic substrate for connecting said first polarization electrodes;

providing a plurality of second polarization electrodes on a back major surface of said piezoelectric ceramic substrate at positions opposing said first polarization electrodes and providing a second connecting electrode on said back major surface of said piezoelectric ceramic substrate at positions not opposing said first connecting electrode for connecting said second polarization electrodes; and applying a voltage across said first polarization electrodes and said second polarization electrodes for polarizing said piezoelectric ceramic substrate.

2. The method of polarizing a piezoelectric ceramic substrate in accordance with claim 1, wherein said piezoelectric ceramic substrate is a mother substrate for producing a plurality of elements.

3. The method of polarizing a piezoelectric ceramic substrate in accordance with claim 1, wherein said first polarization electrodes and said second polarization electrodes are strip-shaped electrodes, and said first connecting electrode and said second connecting electrode are strip-shaped electrodes having widths that are smaller than widths of said first polarization electrodes and said second polarization electrodes.

4. The method of polarizing a piezoelectric ceramic substrate in accordance with claim 1, wherein said piezoelectric ceramic substrate is a mother substrate for producing a plurality of elements, and said elements are filter elements vibrating in a thickness expansion mode and containing capacitors.

5. The method of polarizing a piezoelectric ceramic substrate in accordance with claim 1, wherein said piezoelectric ceramic substrate is a mother substrate for producing a plurality of elements, and said connecting electrodes are formed at peripheral portions of said mother substrate.

6. The method of polarizing a piezoelectric ceramic substrate in accordance with claim 1, wherein said piezoelectric ceramic substrate is a rectangular mother substrate, and said polarization electrodes are strip-shaped electrodes which are formed in parallel with side edges of said piezoelectric ceramic substrate.

7. The method of polarizing a piezoelectric ceramic substrate in accordance with claim 1, wherein said piezoelectric ceramic substrate is a mother substrate for producing a plurality of elements, each of said elements comprises a vibrating portion and a capacitive portion, said vibrating portion of each of said elements is positioned in said polarized portions, and said capacitive portion of said elements is positioned in non-polarized portions of said piezoelectric ceramic substrate.

8. The method of polarizing a piezoelectric ceramic substrate in accordance with claim 1, further comprising the steps of:

aging said piezoelectric ceramic substrate being polarized, measuring a degree of polarization of said piezoelectric ceramic substrate, and forwardly or reversely applying a voltage across said first polarization electrodes and said second polarization electrodes in order to control said degree of polarization.

\* \* \* \* \*